(12) United States Patent
Kajiya et al.

(10) Patent No.: US 8,562,177 B2
(45) Date of Patent: Oct. 22, 2013

(54) LIGHTING DEVICE WITH LEDS MOUNTED ON FLEXIBLE CIRCUIT BOARD SELF MAINTAINED IN BELLOWS SHAPE AND MANUFACTURING METHOD THEREOF

(75) Inventors: Atsushi Kajiya, Oyama (JP); Hidekazu Yoshihara, Moriya (JP); Toru Itani, Ryuugasaki (JP)

(73) Assignee: Nippon Mektron, Ltd., Tokyo-To (JP)

( * ) Notice: Subject to any disclaimer, the term of this patent is extended or adjusted under 35 U.S.C. 154(b) by 0 days.

(21) Appl. No.: 13/518,901

(22) PCT Filed: Jul. 23, 2010

(86) PCT No.: PCT/JP2010/062433
§ 371 (c)(1),
(2), (4) Date: Jun. 25, 2012

(87) PCT Pub. No.: WO2011/077778
PCT Pub. Date: Jun. 30, 2011

(65) Prior Publication Data
US 2012/0281411 A1 Nov. 8, 2012

(30) Foreign Application Priority Data
Dec. 24, 2009 (JP) .................................. 2009-292639

(51) Int. Cl.
*F21V 21/00* (2006.01)
*H01L 33/00* (2010.01)

(52) U.S. Cl.
USPC .. 362/249.04; 362/227; 362/631; 362/249.12

(58) Field of Classification Search
USPC ........................................ 362/249.04, 249.12
See application file for complete search history.

(56) References Cited

U.S. PATENT DOCUMENTS

| | | | | |
|---|---|---|---|---|
| 3,995,152 A | | 11/1976 | Chao | |
| 4,148,096 A | * | 4/1979 | Haas et al. | 362/249.14 |
| 4,173,035 A | * | 10/1979 | Hoyt | 362/249.04 |
| 4,815,981 A | * | 3/1989 | Mizuno | 439/77 |
| 6,371,637 B1 | * | 4/2002 | Atchinson et al. | 362/555 |
| 7,192,157 B2 | * | 3/2007 | Sloan et al. | 362/216 |
| 2004/0037080 A1 | * | 2/2004 | Luk et al. | 362/252 |
| 2009/0116244 A1 | * | 5/2009 | Hsiao et al. | 362/297 |
| 2010/0048861 A1 | * | 2/2010 | Jung et al. | 528/347 |

FOREIGN PATENT DOCUMENTS

| | | |
|---|---|---|
| JP | 05-25749 | 4/1993 |
| JP | 2001-306002 | 11/2001 |
| JP | 2005-340184 | 12/2005 |
| JP | 2007-048638 | 2/2007 |
| JP | 2007-073723 | 3/2007 |
| JP | 2007-287751 | 11/2007 |
| JP | 2009-158910 | 7/2009 |
| JP | 2009-231584 | 10/2009 |
| WO | 91/12638 | 8/1991 |
| WO | 95/11543 | 4/1995 |
| WO | 02/089222 | 11/2002 |
| WO | 2009/054048 | 4/2009 |

OTHER PUBLICATIONS

Machine English translation of JP 2005/340184 to Machida published Dec. 8, 2005.*

* cited by examiner

*Primary Examiner* — Sikha Roy
(74) *Attorney, Agent, or Firm* — Jacobson Holman PLLC

(57) ABSTRACT

A lighting device which can illuminate a large range with a simple configuration, and in which the LEDs or the mounting portions thereof are not likely to be damaged even when vibrations occur as a light source device which uses an LED as a light source, and a manufacturing method thereof are provided. The present invention includes a deformable flexible circuit board having an insulating film made of thermoplastic resin, a wiring layer formed on the insulating film, and an insulating layer formed on the wiring layer and made of thermoplastic resin, and in which a bent portion with a curvature radius "R" (mm) is formed at at least one position, and a plurality of LEDs mounted on the flexible circuit board.

14 Claims, 6 Drawing Sheets

LIGHTING DEVICE WITH LEDS MOUNTED ON FLEXIBLE CIRCUIT BOARD SELF MAINTAINED IN BELLOWS SHAPE AND MANUFACTURING METHOD THEREOF

This is a national stage of PCT/JP10/062,433 filed Jul. 23, 2010 and published in Japanese, which claims the priority of Japanese number 2009-292639 filed Dec. 24, 2009, hereby incorporated by reference.

TECHNICAL FIELD

The present invention relates to a lighting device which uses an LED (a light-emitting diode) as a light source, and a manufacturing method thereof. More particularly, the present invention relates to a lighting device which uses an LED suitable for not only lighting devices used in homes, public facilities or the like, but also lighting devices for automobiles, amusement facilities, roads or the like where vibration resistance is required, and a manufacturing method thereof.

BACKGROUND ART

In recent years, LEDs have been used as light sources of lighting devices. Since LEDs have a longer operating life and generate less heat as compared to incandescent light bulbs or the like, a plurality of LEDs can be used in connection. For example, it has been proposed to form a band-like light source assembly (an LED module) by connecting a plurality of LEDs by a thin plate-like conductor (Patent Literature 1).

CITATION LIST

Patent Literature

[Patent Literature 1]
  International Publication No. WO02/089222 Pamphlet
[Patent Literature 2]
  Japanese Patent Laid-Open No. 2007-48638

SUMMARY OF INVENTION

Technical Problem

However, a lighting device using a conventional LED and a manufacturing method thereof have problems described below.

Generally, light emitted from the LED has high directionality, so that a plurality of LEDs need to be arranged toward different directions so as to illuminate a large angular range. Thus, for example, when the LED is used for a long lighting device which uniformly emits light over 360 degrees in a circumferential direction such as a linear fluorescent light, a plurality of LEDs need to be dispersedly arranged in the circumferential direction and an axial direction. Therefore, there are problems that a complicated manufacturing process is required, and a manufacturing cost increases.

As one example of the lighting device which uses the LED, Patent Literature 2 also proposes an LED bulb composed of an LED module, a circuit board for driving an LED, a case, a base or the like. However, since the LED as a light source is mounted on a plane in the conventional LED bulb, it is difficult to illuminate a large range.

Moreover, the lighting device which uses the LED as a light source is used in a place with vibrations such as automobiles, amusement facilities, and roads. However, there is a problem that the lighting device breaks down with the LED or a mounting portion thereof being damaged by vibrations.

That is, conventionally, there has not been disclosed any lighting device which can illuminate a large range with a simple configuration and in which an LED or a mounting portion thereof is difficult to damage even when vibrations occur as a light source device which uses an LED as a light source. It is thus an object of the present invention to provide a lighting device which can illuminate a large range with a simple configuration and in which an LED or a mounting portion thereof is not likely to be damaged even when vibrations occur as a light source device which uses an LED as a light source, and a manufacturing method thereof.

Solution to Problem

In order to achieve the above object, the present invention includes:
  a deformable flexible circuit board having an insulating film made of thermoplastic resin, a wiring layer formed on the insulating film, and an insulating layer formed on the wiring layer and made of thermoplastic resin, and in which a bent portion with a curvature radius "R" (mm) is formed at at least one position; and
  a plurality of LEDs mounted on the flexible circuit board.

With such a configuration, since the present invention includes the flexible circuit board in which the bent portion with the curvature radius "R" (mm) is formed, a larger range can be illuminated as compared to a case in which LEDs are mounted on a planar board. Also, as compared to the planar board, more LEDs can be mounted in a limited space. That is, the number of LEDs mounted per unit region can be increased, so that brightness of the lighting can be improved. Also, since the bent portion is formed, the flexible circuit board is configured to be deformable. Thus, even when an external force or the like is applied to cause vibrations, the vibrations can be absorbed by the entire flexible circuit board. The LEDs are thereby not likely to be damaged even when vibrations occur. Also, since the flexible circuit board is formed by the thermoplastic resin, the flexible circuit board can be freely molded by heating and pressurizing the thermoplastic resin. That is, the illumination range can be easily changed. Moreover, the thermoplastic resin no longer required can be restored to an original shape by heating again, so that recycling of resources is enabled.

Also, preferably,
  the curvature radius "R" (mm) is 0.3 mm or more, and
  the flexible circuit board
  is configured to be deformable while maintaining the curvature radius "R" (mm).

With such a configuration, since the curvature radius "R" (mm) of the bent portion is 0.3 mm or more, a stress applied to the wiring layer in the bent portion can be reduced to a level at which the wiring layer is not separated or broken even when a wire width is further made smaller. Also, since the flexible circuit board is configured to be deformable while maintaining the curvature radius "R" (mm), the wiring layer can maintain its shape along the insulating film in the bent portion. That is, even when the flexible circuit board is repeatedly bent and stretched, is bent so as to have a large curvature, or is deformed due to thermal expansion caused when a temperature repeatedly rises and drops, the wiring layer is not likely to be separated or broken in the bent portion, so that excellent connection reliability can be maintained. Furthermore, since the curvature radius "R" (mm) is maintained in the bent portion, that is, since three-dimensional shapes of the flexible circuit board and the lighting device are self-maintained, it is not necessary to provide shape supporting means (a support column or the like) so as to maintain the three-dimensional shape of the flexible circuit board or the lighting device in effecting illumination. Accordingly, a manufacturing process can be simplified, and a manufacturing cost can be reduced.

Also, preferably, connecting means connected to a driving circuit that supplies power to the LEDs is provided at both ends of the flexible circuit board.

With such a configuration, since the lighting device can be easily attached to the driving circuit by providing the connecting means, the manufacturing cost of the lighting device can be reduced. Also, since the flexible circuit board can be easily replaced, usability is improved.

Also, preferably, the connecting means is male and female crimp contacts.

With such a configuration, since the male and female crimp contacts which are relatively inexpensive connecting means are provided in the lighting device, the manufacturing cost of the lighting device can be reduced.

Also, preferably, the thermoplastic resin is liquid-crystal polymer.

With such a configuration, since the liquid-crystal polymer which is relatively inexpensive and easily molded is used as a material of the flexible circuit board, the manufacturing cost of the lighting device can be suppressed.

Also, preferably, the flexible circuit board is at least partially transparent.

With such a configuration, since light emitted from the LEDs can be transmitted through the transparent portion of the flexible circuit board, the lighting device can illuminate a larger range.

Also, in order to achieve the above object, in the present invention, a method for manufacturing the lighting device includes:

a first step of bending the flexible circuit board on which the LEDs are mounted by a molding apparatus, and thereby forming the bent portion with the curvature radius "R" (mm) in the flexible circuit board, and a second step of heating at least the bent portion in the flexible circuit board in which the bent portion with the curvature radius "R" (mm) is formed.

With such a manufacturing method, since the bent portion can be formed in the flexible circuit board by the relatively simple manufacturing method, the manufacturing cost of the lighting device can be suppressed.

Also, preferably, in the first step, the bent portion with the curvature radius "R" (mm) is formed in a plurality of numbers in the flexible circuit board by pressing the molding apparatus against the flexible circuit board from a thickness direction with a tension being applied to both ends of the flexible circuit board.

With such a manufacturing method, the lighting device having the flexible circuit board in which the plurality of bent portions are formed, such as a bellows structure, can be easily manufactured, and the manufacturing cost of the lighting device can be reduced. Also, since the plurality of bent portions are provided, a larger range can be illuminated.

Also, preferably, the first step and the second step are performed by using the molding apparatus where a rubber-like elastic member is provided in a contact region with the flexible circuit board in the first step and the second step.

With such a manufacturing method, the rubber-like elastic member functions as a buffer, so that the flexible circuit board and the LEDs can be protected from impact, wear or the like.

That is, there is no risk that the LEDs mounted on the flexible circuit board are crushed by the molding apparatus in the manufacturing process. Also, since the LEDs and the molding apparatus come into contact with each other via the rubber-like elastic member, heat is not directly transferred to the LEDs during heating, and the LEDs can be prevented from damage and deterioration due to heat.

Also, preferably, the thermoplastic resin is liquid-crystal polymer, and in the second step, a heating temperature is a temperature by which the flexible circuit board has a surface temperature of 150° C. or more and less than a thermal deformation starting temperature of the liquid-crystal polymer, and a heating time is 1 hour or less.

With such a manufacturing method, since the liquid-crystal polymer is heated at the heating temperature less than the thermal deformation starting temperature of the liquid-crystal polymer, the liquid-crystal polymer does not become fluid, and appearance and performance of the flexible circuit board are not deteriorated. Also, since the surface temperature of the flexible circuit board is 150° C. or more by the heating temperature, the bent portions can be reliably formed in the liquid-crystal polymer. Furthermore, the bent portions are not restored to an original shape (the curvature radius "R" (mm) is maintained) even after the heating is completed. Also, when the heating time is 1 hour or less, production efficiency can be improved, and problems of discoloration and thermal deformation of the liquid-crystal polymer, and damage of the LEDs caused when the heating time is long can be avoided. Furthermore, the heating is performed at a relatively low temperature, manufacturing energy can be reduced, and the manufacturing cost of the lighting device can be reduced.

Advantageous Effect of Invention

As described above, the present invention can provide the lighting device which can illuminate a large range with a simple configuration and in which the LEDs or mounting portions thereof are not likely to be damaged even when vibrations occur at a light source device which uses an LED as a light source, and the manufacturing method thereof.

DESCRIPTION OF EMBODIMENTS

Figure 1:
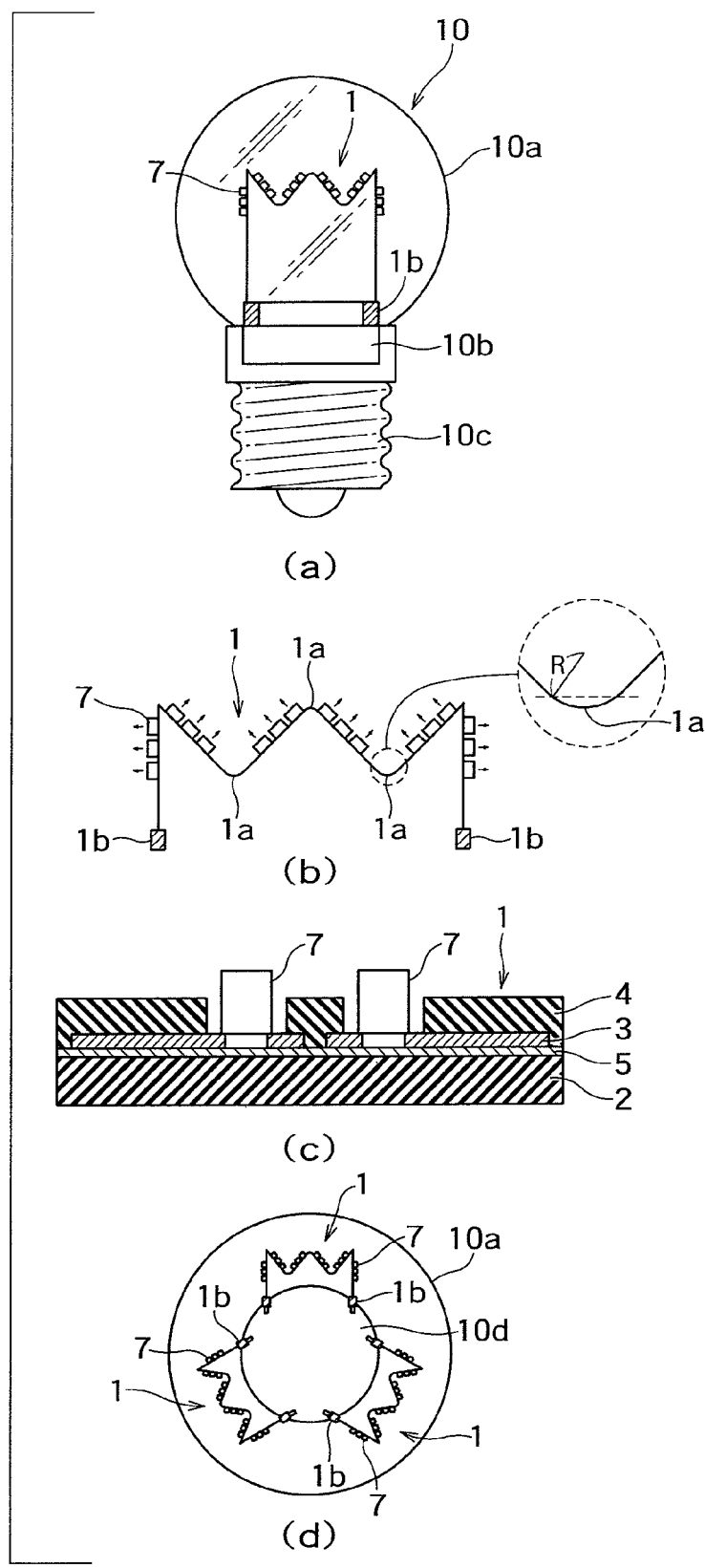
FIG. 1 are schematic configuration views of a lighting device according to a present embodiment.

In the following, embodiments for carrying out the present invention will be described in detail as an example by reference to the drawings. It is to be appreciated that dimensions, materials, shapes of constituent components, a relative arrangement thereof, and the like described in the following embodiments are not intended to limit the scope of the invention to the details unless otherwise noted.

Embodiments (1: Schematic Configuration of Lighting Device)

A schematic configuration of a lighting device 10 according to the present embodiment will be described by reference to FIG. 1. The lighting device 10 includes a plurality of LEDs 7, a flexible circuit board 1 on which the LEDs 7 are mounted, connecting means 1b provided at both ends of the flexible circuit board 1 and connected to a driving circuit section 10b that drives the LEDs 7, a dome-like light transmitting section 10a that covers the LEDs 7, and a cylindrical base section 10c connected to an external power source. That is, in the lighting device 10 according to a present embodiment, the LED-mounted flexible circuit board 1 is used for a filament section.

Various semiconductor elements can be used as the LEDs 7. Examples thereof include semiconductor elements containing as a raw material a compound such as GaAs (gallium arsenide), GaP (gallium phosphide), GaAsP (gallium arsenide phosphide), GaAlAs (gallium aluminum arsenide), AlGaInP (aluminum gallium indium phosphide), SiC (silicon carbide), and GaN (gallium nitride). A pin junction where p-type, i-type, and n-type semiconductors thereof are stacked, or a tandem type where the pin junctions are multi-stacked may be used. In a case in which silicon is used, a semiconductor element containing monocrystalline silicon, polycrystalline silicon, amorphous silicon, a monocrystalline compound, and a polycrystalline compound may be used.

The light transmitting section 10a covers and protects the LEDs 7, and transmits light emitted from the LEDs 7. The light transmitting section 10a is preferably excellent in impact resistance and heat resistance. For example, the light transmitting section 10a is preferably made of opaque white polycarbonate resin.

The base section 10c has a hollow space therein, and opens on one end side and has a bottom on the other end side. An outer circumferential surface of the base section 10c functions as a one pole terminal, and the other pole terminal is provided projecting on a bottom surface so as to be insulated from the one pole terminal on the outer circumferential surface. The other pole terminal and the one pole terminal can be electrically connected to the connecting means 1b through a lead wire.

Male and female crimp contacts are preferably used for the connecting means 1b so as to easily electrically connect the flexible circuit board 1 and the driving circuit section 10b that drives the LEDs 7. Preferable examples of the male and female crimp contacts include YD/YDD/YZ/YK/YM series, YZ/YE/YK/YM series, YP series, and YT/YP series manufactured by TYCO Electronics AMP Inc.

(2: Schematic Configuration of Flexible Circuit Board)

In the lighting device 10 according to the present embodiment, the plurality of LEDs 7 are provided on the flexible circuit board 1 in which a bent portion 1a is formed at at least one position. In the following, a schematic configuration of the flexible circuit board will be described.

Figure 6:
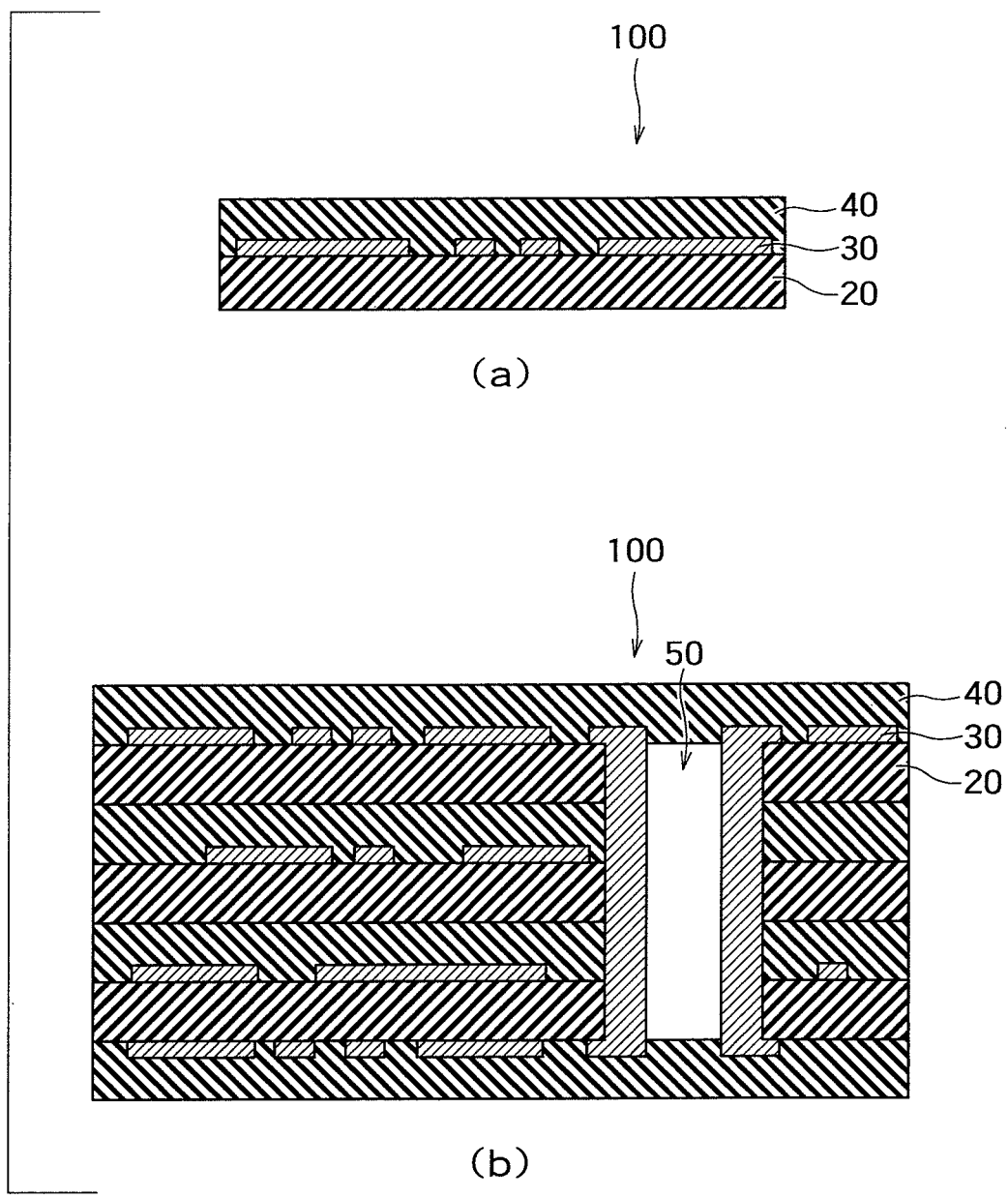
FIG. 6 are schematic sectional views of a conventional flexible circuit board.

FIG. 6 show a schematic configuration of a conventionally-used flexible circuit board 100. As shown in FIG. 6(*a*), the flexible circuit board 100 includes a wiring layer 30 formed on an insulating film 20, and an insulating layer 40 (generally referred to as coverlay layer (CL layer)) formed on the wiring layer 30. Moreover, as shown in FIG. 6(*b*), a flexible circuit board where the flexible circuit boards 100 are multi-stacked is also known. As shown in the drawing, a through hole 50 is provided in the multi-stacked flexible circuit boards 100 so as to electrically connect the respective wiring layers 30. Complicated connection between wires is thereby enabled. In addition, a polyimide film is used for the insulating film 20 and the insulating layer 40. If the flexible circuit board 100 as described above is repeatedly bent and stretched, or is bent so as to have a large curvature, the wiring layer (i.e., a copper foil) is separated from an insulating material (i.e., the insulating film and an adhesive layer provided as needed), or the wiring layer is broken in a bent portion due to a bending stress. As a result, defective connection may be caused. Similar defective connection may also be caused when thermal expansion is repeated. That is, it is not practically preferable to use the conventional flexible circuit board as described above in a lighting device. Thus, in the present embodiment, the flexible circuit board 1 which can improve connection reliability of the flexible circuit board 1 and can also improve vibration resistance of the lighting device 10 is used in the lighting device 10.

FIG. 1(*c*) is a schematic sectional view of the flexible circuit board 1 according to the present embodiment. As shown in the drawing, the flexible circuit board 1 is composed of an insulating film 2, a wiring layer 3 formed on the insulating film 2, an insulating layer 4 formed on the wiring layer 3, and the LEDs 7 mounted on the wiring layer 3. In addition, although the wiring layer 3 is adhered onto the insulating film 2 via an adhesive layer 5, the adhesive layer 5 may not be provided. Also, as shown in FIG. 1(*b*), the flexible circuit board 1 has the bent portion 1a (also referred to as three-dimensional molded portion or curved portion) with a curvature radius "R" (mm) at at least one position. Although the flexible circuit board 1 having a bellows shape with a plurality of bent portions 1a is described in the present embodiment, the flexible circuit board 1 is not limited to the above shape. For example, a substantially U shape in which the bent portion 1a is provided at one position may also be used.

The wiring layer 3 is formed by attaching a well-known metal foil such as a rolled copper foil and an electrolytic copper foil to the insulating film 2 via the adhesive layer 5. Alternatively, the wiring layer 3 may also be formed by a method such as vapor deposition or sputtering on a surface of the insulating film 2 (or a surface of the adhesive layer 5 formed on the insulating film 2) by using metal such as copper or silver. The adhesive layer 5 is formed by using well-known thermoplastic resin such as polyimide, or well-known thermosetting resin such as cyanate ester resin, polyphenylene ether resin, phenolic resin, naphthalene resin, urea resin, amino resin, alkyd resin, silicon resin, furan resin, unsaturated polyester resin, epoxy resin, and polyurethane resin. Alternatively, the adhesive layer 5 may also be formed by dispersing an inorganic filler such as silica or alumina in the above organic resin.

Thermoplastic resin described below is recommended for the insulating film 2 and the insulating layer 4. Examples include liquid-crystal polymer (e.g., trade name "Rodrun" (manufactured by Unitika Ltd.), "EPE" (manufactured by Mitsubishi Chemical Corporation), "Idemitsu LCP" (manufactured by Idemitsu Petrochemical Co., Ltd.), "Econol" (manufactured by Sumitomo Chemical Co., Ltd.), "Xyder" (manufactured by Nippon Petrochemicals Co., Ltd.), "LCP" (manufactured by Tosoh Corporation), "Vectra" (manufactured by Hoechst Celanese Corporation), "SRP" (manufactured by Imperial Chemical Industries Ltd.), "Vecstar" (manufactured by Kuraray Co., Ltd.), "Biac" (manufactured by Japan Gore-Tex Inc.), "Sumica Super LCP" (manufactured by Sumitomo Chemical Co., Ltd.)), polyethylene naphthalate (PEN), polyethylene terephthalate (PET), cycloolefin polymer (COP, e.g., trade name "Zeonex" (manufactured by Zeon Corporation), and "Zeonor" (manufactured by Zeon Corporation)). The same material may be selected, or different materials may be selected as the thermoplastic resin used for the insulating film 2 and the insulating layer 4. Please note that a case in which liquid-crystal polymer is used for the insulating film 2 and the insulating layer 4 will be described below.

As described above, the flexible circuit board 1 according to the present embodiment is formed in the bellows shape having the bent portions is with the curvature radius "R" (mm) at a plurality of positions. In a case in which the flexible circuit board 1 has such a shape, the flexible circuit board 1 can be deformed by expansion and contraction. Even when an external force is applied thereto, the entire flexible circuit board 1 is deformed by expansion and contraction, and can thereby prevent a stress from being locally concentrated. Thus, even when vibrations occur, the LEDs 7 or mounting portions thereof are not likely to be damaged. Also, for example, when the LEDs 7 are mounted on both sides (excluding the bent portion 1a) of each of the bent portions 1a as shown in FIG. 1(b), a large range can be illuminated by the LEDs 7. As compared to a case in which LEDs are mounted on a planar board, the number of LEDs mounted per unit region is also increased, so that brightness of the lighting can be improved. In addition, although the case in which one flexible circuit board 1 is provided is described here, a plurality of flexible circuit boards 1 may also be provided in one lighting device as shown in FIG. 1(d). In this case, the illumination range can be further increased to a wider range.

Furthermore, the flexible circuit board 1 according to the present embodiment has a characteristic configuration as described below. That is, normally, when the bent portion is formed in the flexible circuit board, the curvature radius of the bent portion is changed to cause separation or breakage of the wiring layer due to a stress locally concentrated into the bent portion caused when an external force is applied to cause vibrations or the like. However, in the present embodiment, the flexible circuit board 1 is manufactured by a manufacturing method described below, so that the flexible circuit board 1 in which the curvature radius "R" (mm) of the bent portion 1a is maintained even when vibrated can be obtained. Accordingly, the curvature radius "R" (mm) of the bent portion 1a can be maintained constant, there is no risk that wires are separated or broken in the bent portion 1a, and the vibration resistance of the lighting device 10 can be improved.

(3: Manufacturing method of lighting device)

The lighting device 10 according to the present embodiment is manufactured by manufacturing the flexible circuit board 1, mounting the LEDs 7 on the manufactured flexible circuit board 1, and further bending the flexible circuit board 1 on which the LEDs 7 are mounted by a method described below. In the following, a method for manufacturing the lighting device 10 will be sequentially described.

Figure 2:
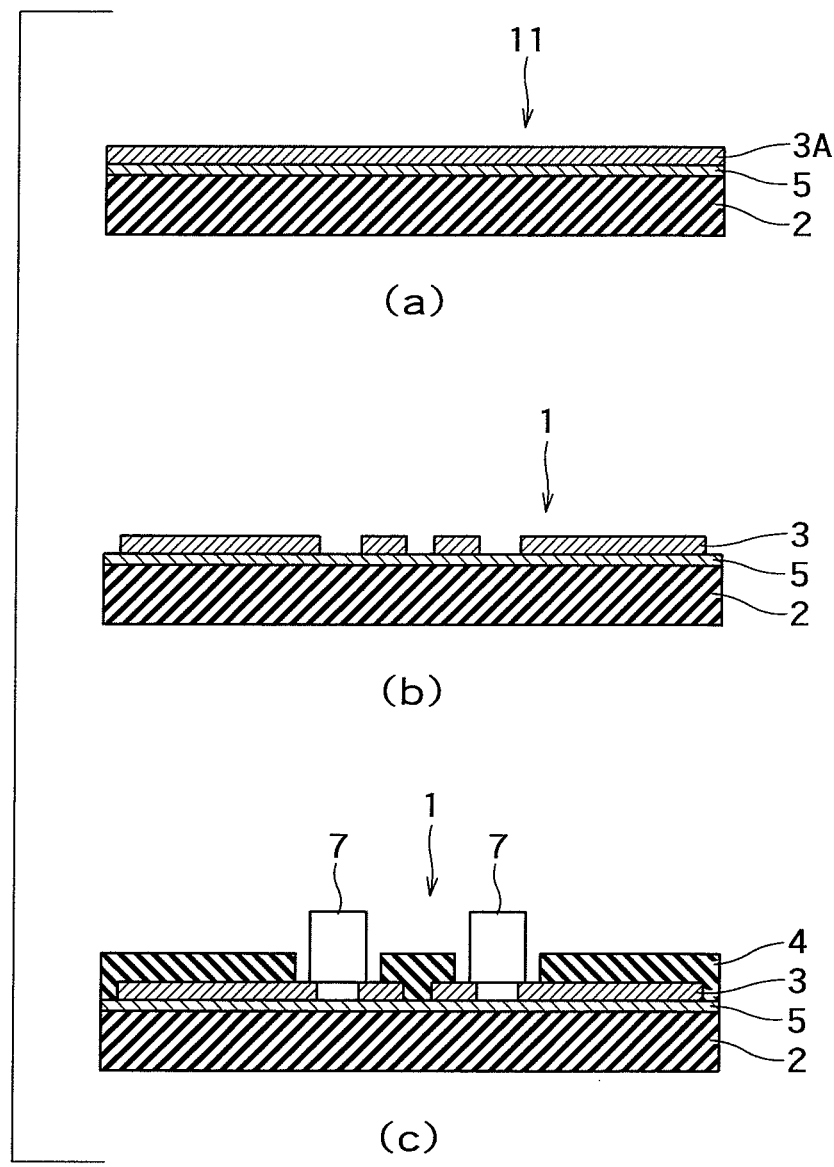
FIG. 2 are schematic views illustrating a method for manufacturing a flexible circuit board according to the present embodiment.
Figure 3:
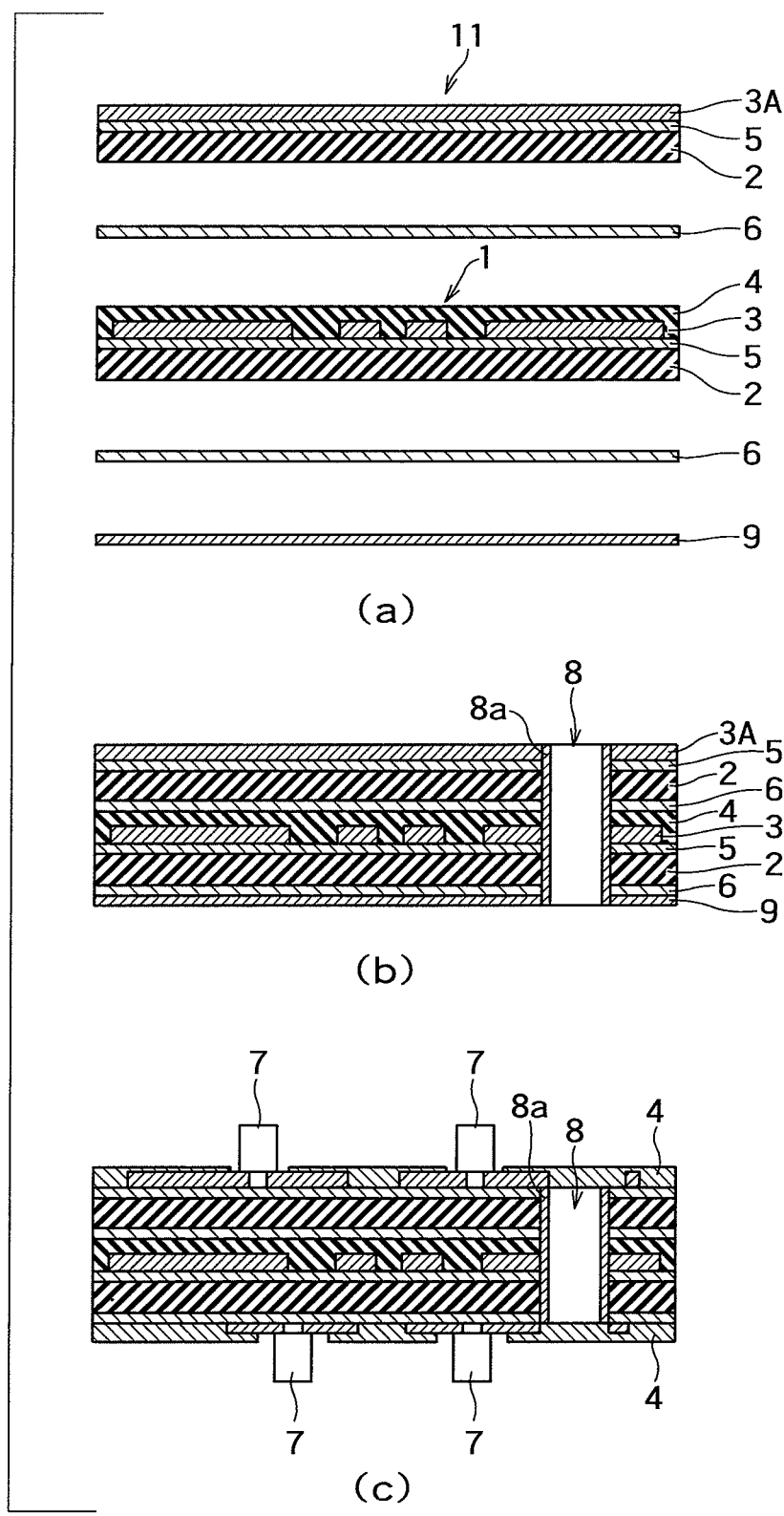
FIG. 3 are schematic views illustrating a method for manufacturing a flexible circuit board according to the present embodiment.

First, a process for manufacturing the flexible circuit board 1 will be described by reference to FIGS. 2 and 3. FIG. 2 are schematic views illustrating a process for manufacturing a single-sided flexible circuit board 1, and FIG. 3 are schematic views illustrating a process for manufacturing a multi-layer flexible circuit board 1 having a three-layer structure.

When the single-sided flexible circuit board 1 is manufactured, a metal-clad film 11 is prepared first as shown in FIG. 2(a). The metal-clad film 11 can be formed by forming the adhesive layer 5 on the surface of the insulating film 2 made of the thermoplastic resin, stacking a metal foil 3A on the surface of the adhesive layer 5, and integrating the three layers by thermal compression bonding. In addition, examples of another method for forming the metal-clad film 11 include a method of applying varnish as a precursor of an insulating film on a metal foil and drying the precursor, a method of forming a metal layer on an insulating film by vapor deposition or sputtering, and a method of forming a wiring layer by electrolytic plating on an insulating film to which conductive paste is applied.

Subsequently, as shown in FIG. 2(b), the flexible circuit board 1 is obtained by etching the metal layer (the metal foil 3A) into a desired wiring pattern and thereby forming the wiring layer 3. Subsequently, as shown in FIG. 2(c), the insulating layer 4 is formed by applying the thermoplastic resin on the wiring layer 3. Alternatively, the insulating layer 4 may also be formed by thermally compression-bonding an insulating film made of the thermoplastic resin. After the insulating layer 4 is formed as described above, the LEDs 7 are fixed to desired positions, and the LEDs 7 and the wiring layer 3 are electrically connected to each other. As described above, the single-sided flexible circuit board 1 on which the LEDs 7 are mounted can be obtained through the process shown in FIGS. 2(a) to 2(c). The connecting means 1b described above may also be attached to the both ends of the flexible circuit board 1. In addition, the LEDs 7 are preferably mounted in a region excluding a portion to be the bent portion, i.e., a region with which a mold (described in detail below) does not come into contact when the bent portion is formed.

As the flexible circuit board 1 according to the present embodiment, not only the single-sided structure described above, but the multi-layer structure described below may also be employed. A method for manufacturing the multi-layer flexible circuit board having the three-layer structure will be described by reference to FIG. 3.

First, as shown in FIG. 3(a), the metal-clad film 11 shown in FIG. 2(a), the single-sided flexible circuit board 1, and a metal foil 9 are prepared. Two adhesive sheets 6 that join the three sheets are further prepared. As the adhesive sheets 6, the above thermoplastic resin for the insulating layer 4 molded into a sheet-like shape is used. The above sheets are stacked as shown in the drawing, and the stacked sheets are heated and pressed together to be integrated.

Subsequently, as shown in FIG. 3(b), a through hole 8 is formed at a desired position by using a drill or a laser, and the through hole is subjected to plating 8a to electrically connect the wiring layers 3. FIG. 3(b) shows a configuration in which the wiring layers are connected by plating. In addition, as another method, the through hole 8 may be filled with conductive paste, and the conductive paste may be hardened to electrically connect the wiring layers.

Subsequently, as shown in FIG. 3(c), the metal foils 3A and 9 provided on respective surfaces are formed into the wiring layers 3 having desired wiring patterns by a method such as etching. After that, the insulating layers 4 are formed in a similar manner to the above method (see FIG. 2(c)), and the LEDs 7 are mounted thereon. Accordingly, the multi-layer flexible circuit board having the three-layer structure on which the LEDs 7 are mounted can be manufactured. In addition, although the configuration having the three-layer structure is described here, the structure of the multi-layer flexible circuit board is not limited to the three-layer structure.

Figure 4:
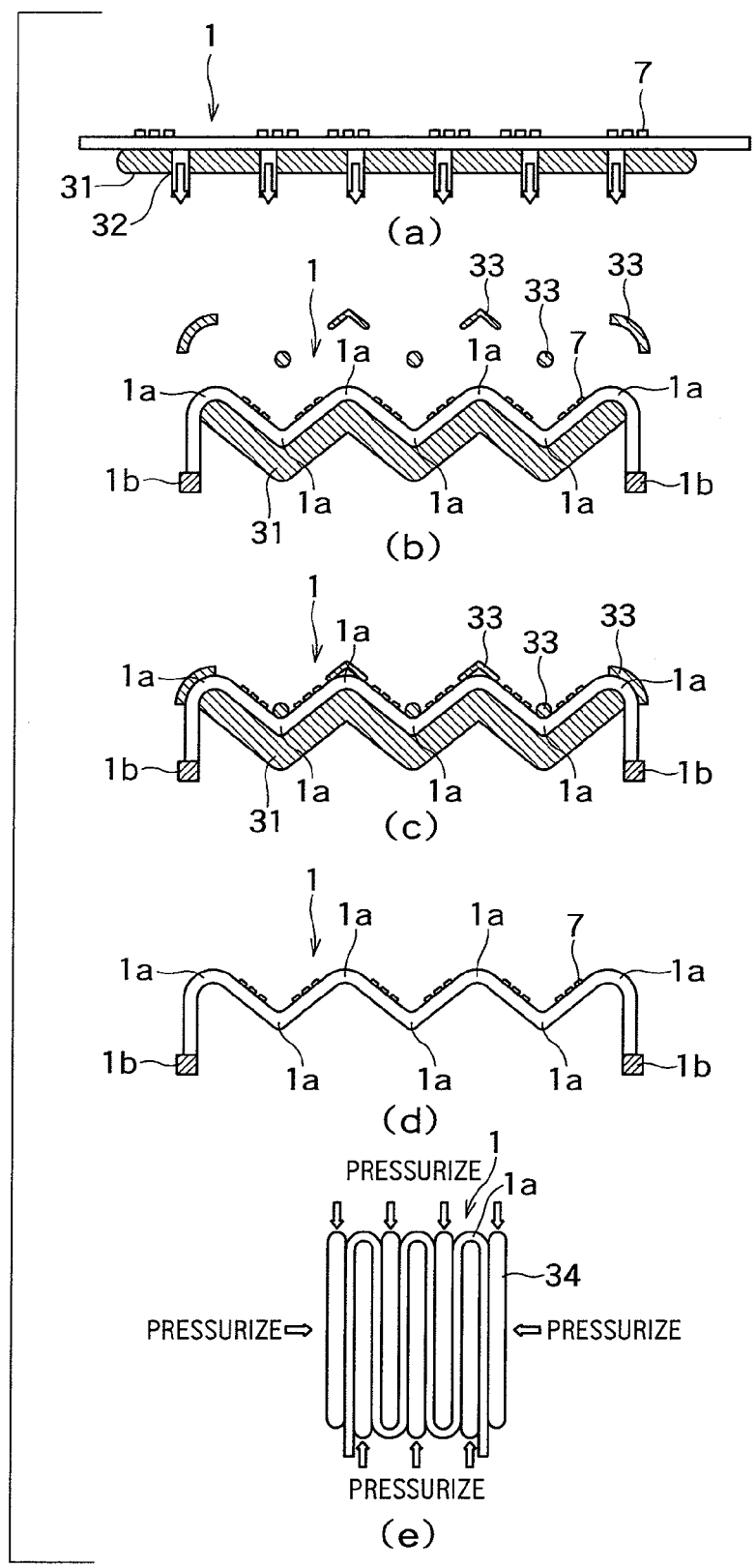
FIG. 4 are views illustrating a process for manufacturing the lighting device according to the present embodiment.

Next, a method for forming the bent portion 1a in the flexible circuit board 1 manufactured by the aforementioned manufacturing method will be described by reference to FIG. 4.

When the bent portion 1a is formed in the flexible circuit board 1, the method includes a first step of bending the flexible circuit board 1 on which the LEDs 7 are mounted by a molding apparatus, and thereby forming the bent portion is with the curvature radius "R" (mm), and a second step of heating at least the bent portion 1a in the flexible circuit board 1 in which the bent portion 1a with the curvature radius "R" (mm) is formed. Also, as shown in FIG. 4, the molding apparatus includes a bendable mold 31 having vacuums 32, and pressing members 33 (also referred to as partial mold) movable toward the flexible circuit board 1 from a thickness direction of the flexible circuit board 1 in the present embodiment. In addition, although the pressing members 33 are configured to be movable in the present embodiment, one of the mold 31 and the pressing members 33 may be configured to be movable.

In the first step, the flexible circuit board 1 is placed on the mold 31, and is absorbed and fixed onto the mold 31 by the vacuums 32 as shown in FIG. 4(a). In addition, preferably, the LEDs 7 are already mounted and the connecting means 1b is already attached to the both ends in the above state. Subsequently, as shown in FIG. 4(b), the mold 31 is deformed in a state in which the flexible circuit board 1 is absorbed and fixed onto the mold 31, and the bent portions is are thereby formed in the flexible circuit board 1. In addition, although the plurality of bent portions is are formed here, the bent portion 1a may be formed at at least one position. Subsequently, as shown in FIG. 4(c), the pressing members 33 provided opposing the mold 31 move in the thickness direction (a vertical direction in FIGS. 4(a) to 4(d)) of the flexible circuit board 1, and respectively come into press-contact with the bent portions 1a of the flexible circuit board 1. At this point, the pressing members 33 do not come into contact with the LEDs 7 mounted on the flexible circuit board 1, and there is not risk that the LEDs 7 are damaged by contact with the pressing members 33. In addition, at least after FIG. 4(b), a tension is applied to the both ends of the flexible circuit board 1 by unillustrated pressurizing means. Here, the curvature radius "R" (mm) of the bent portion 1a can be changed by changing shapes of the mold 31 and the pressing members 33. Similarly, the number of bent portions 1a, an interval between the bent portions 1a, or other factors can also be freely set by changing dimensions, intervals of the mold 31 and the pressing members 33. Also, a pressing force for pressing the flexible circuit board 1 by the pressing members 33 may be a pressing force at least large enough to reliably form the bent portions 1a in the flexible circuit board 1, and may be appropriately changed according to a thickness, a material or the like of the flexible circuit board 1.

In the second step, at least the bent portions 1a of the flexible circuit board 1 in which the plurality of bent portions 1a are formed with the tension being applied to the both ends and the pressing members 33 being pressed thereagainst are heated. In the present embodiment, the flexible circuit board 1 is heated by putting the flexible circuit board 1 in which the bent portions 1a are formed into a heating apparatus together with the mold 31 and the pressing members 33. However, a heating member may be provided inside at least one of the mold 31 and the pressing members 33 to heat at least the bent portions 1a of the flexible circuit board 1 by heat generated from the heating member. In addition, in the present embodiment (when the liquid-crystal polymer is used), a heating temperature is set to a temperature by which the flexible circuit board 1 has a surface temperature of 150° C. or more and less than a thermal deformation starting temperature of the liquid-crystal polymer, and a heating time is set to 1 hour or less. When the heating is performed at the temperature by which the flexible circuit board 1 has a surface temperature of 150° C. or more and less than the thermal deformation starting temperature of the liquid-crystal polymer, the liquid-crystal polymer does not become fluid, and appearance and performance of the flexible circuit board 1 are not deteriorated. Also, since the surface temperature of the flexible circuit board 1 is 150° C. or more by the heating temperature, the bent portions 1a can be reliably formed in the liquid-crystal polymer. Furthermore, the bent portions 1a are not restored to an original shape (the curvature radius "R" (mm) is maintained) even after the heating is completed. Also, when the heating time is 1 hour or less, production efficiency can be improved, and problems of discoloration and thermal deformation of the liquid-crystal polymer, damage of the wiring layer 3, and damage and deterioration of the LEDs 7 caused when the heating time is long can be avoided. In addition, although the case in which the liquid-crystal polymer is used for the insulating film 2 and the insulating layer 4 is described here, a material applicable to the insulating film 2 and the insulating layer 4 is not limited thereto as described above. When another material is selected, the bent portions 1a can be formed by appropriately changing the heating temperature and the heating time described above (however, an upper limit of the heating temperature is a temperature less than a thermal deformation starting temperature of the selected material).

By performing the first step and the second step described above, the LED-mounted flexible circuit board 1 having the curvature radius "R" (mm) at at least one position and being deformable by expansion and contraction while maintaining the curvature radius "R" (mm) can be manufactured. After that, the above flexible circuit board 1 is mounted to the filament section shown in FIG. 1(a), for example, and the connecting means 1b is connected to the driving circuit section 10b, so that the lighting device 10 capable of illuminating a large range can be obtained. In addition, the first step and the second step described above may be performed at the same time. That is, a method of bending the flexible circuit board 1 by the pressing members 33 while heating the bent portions 1a may also be employed. In addition, a rubber-like elastic member is preferably provided on the mold 31 and the pressing members 33 in a contact region with the flexible circuit board 1 in the first step and the second step. With such a configuration, the rubber-like elastic member functions as a buffer, so that the flexible circuit board 1 can be protected from impact, wear, or the like. The rubber-like elastic material is not specifically limited as long as the material has wear resistance, impact resistance, buckling resistance or the like. For example, urethane rubber, chloroprene rubber, NBR, fluorine rubber, silicon rubber, and natural rubber may be used.

(4: Effect Verification)

Examples 1 to 6 and Comparative Examples 1 to 12 were compared under verification experiments described below so as to verify effects of the lighting device and the manufacturing method thereof according to the present embodiment. Verification results thereof will be described.

First, in Examples 1 to 6, Espanex L (trade name) (manufactured by Nippon Steel Chemical Co., Ltd., film thickness: 50 µm, thickness of rolled copper foil: 18 µm, thermal deformation starting temperature: 290° C.) that is a single-sided copper-clad liquid-crystal polymer film was prepared as a copper-clad film. Meanwhile, in Comparative Examples 1 to 6, S'perflex (trade name) (manufactured by Sumitomo Metal Mining Co., Ltd., polyimide film: Kapton-EN, film thickness: 50 µm, thickness of copper foil: 18 µm) that is a single-sided copper-clad two-layer polyimide film was prepared as the copper-clad film. Also, in Comparative Examples 7 to 12, a single-sided copper-clad three-layer polyimide film (polyimide film: Kapton-EN, film thickness: 50 µm, thickness of rolled copper foil: 18 µm, adhesive: epoxy resin, thickness of adhesive: 10 µm) was prepared as the copper-clad film. In addition, the polyimide film: Kapton-EN used in Comparative Examples 1 to 12 has thermosetting properties, and circuit boards in Comparative Examples 1 to 12 differ from the flexible circuit boards 1 according to Examples 1 to 6 at least in this point.

Figure 5:
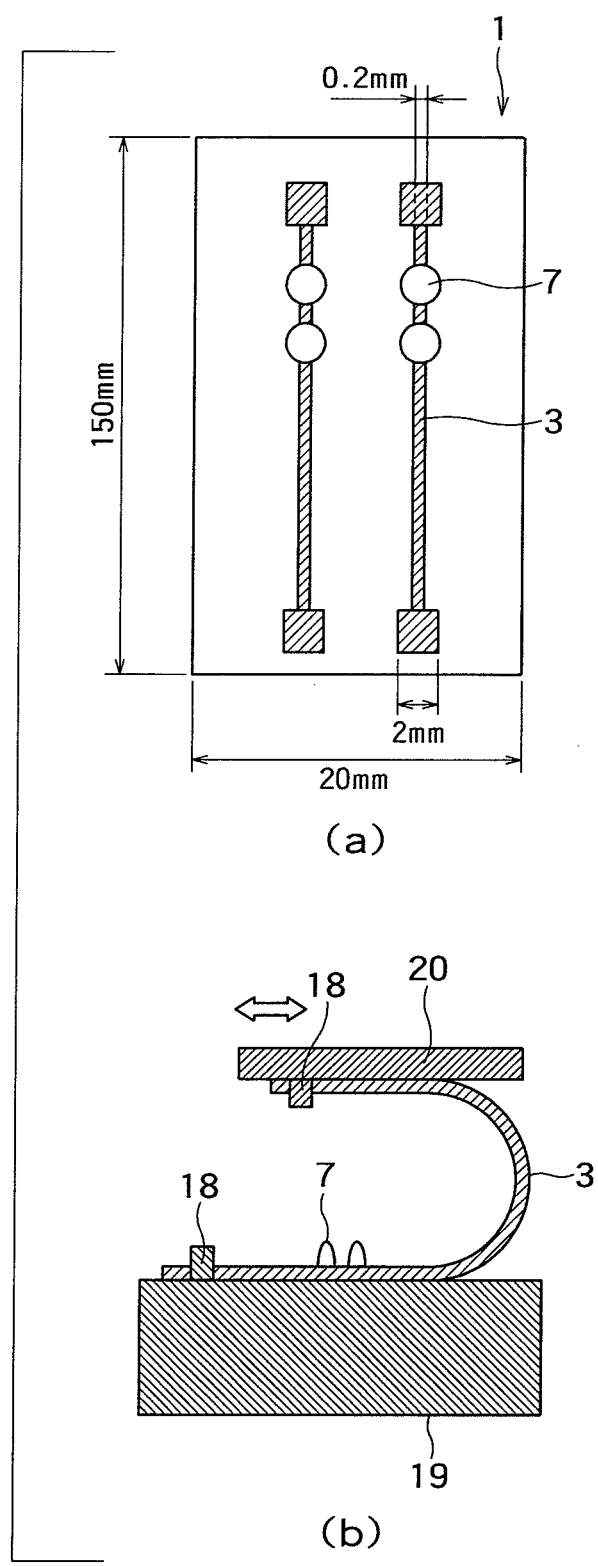
FIG. 5 are schematic views illustrating a method of a vibration test according to the present embodiment.

Subsequently, these samples were subjected to etching, and the wiring layers 3 having a wiring pattern as shown in FIG. 5(a) were formed. The single-sided flexible circuit boards 1 were thereby obtained. A circuit board width, a wire width or the like are as shown in the drawing. The obtained single-sided flexible circuit boards 1 were then molded on conditions shown in Table 1 (the curvature radius (mm), the surface temperature (° C.) of the board, the molding time (h)). In addition, the same molding apparatus as that shown in FIGS. 4(a) to 4(c) was used as the molding apparatus here.

TABLE 1

| SAMPLE | CURVATURE RADIUS (mm) | SURFACE TEMPERATURE (° C.) | MOLDING TIME (h) |
| --- | --- | --- | --- |
| EXAMPLE 1 | 0.3 | 150 | 1 |
| EXAMPLE 2 | 0.3 | 200 | 1 |
| EXAMPLE 3 | 0.3 | 250 | 1 |
| EXAMPLE 4 | 1.0 | 150 | 1 |
| EXAMPLE 5 | 1.0 | 200 | 1 |
| EXAMPLE 6 | 1.0 | 250 | 1 |
| COMPARATIVE EXAMPLE 1 | 0.3 | 150 | 1 |
| COMPARATIVE EXAMPLE 2 | 0.3 | 200 | 1 |
| COMPARATIVE EXAMPLE 3 | 0.3 | 250 | 1 |
| COMPARATIVE EXAMPLE 4 | 1.0 | 150 | 1 |
| COMPARATIVE EXAMPLE 5 | 1.0 | 200 | 1 |
| COMPARATIVE EXAMPLE 6 | 1.0 | 250 | 1 |
| COMPARATIVE EXAMPLE 7 | 0.3 | 150 | 1 |
| COMPARATIVE EXAMPLE 8 | 0.3 | 200 | 1 |
| COMPARATIVE EXAMPLE 9 | 0.3 | 250 | 1 |
| COMPARATIVE EXAMPLE 10 | 1.0 | 150 | 1 |
| COMPARATIVE EXAMPLE 11 | 1.0 | 200 | 1 |
| COMPARATIVE EXAMPLE 12 | 1.0 | 250 | 1 |

After the bent portions were formed in the respective samples on the conditions in Table 1, an LED lighting test was performed so as to evaluate whether or not the LEDs of the respective samples were damaged. The number of tests (N) was set to 20 with respect to each of the samples. Table 2 shows results.

Next, a connection reliability test assuming use in an environment with vibrations was performed. To evaluate the obtained connection reliability of the respective samples, a "repeated bend test" indicated in IPC-240C was performed. A testing method will be simply described by reference to FIG. 5(b). FIG. 5(b) schematically shows an apparatus used in the "repeated bend test". First, the both ends of the flexible circuit board 1 were respectively fixed to a fixing plate 19 and a vibrating plate 20 by fixing sections 18. At this point, a distance between the fixing plate 19 and the vibrating plate 20 was set so as to obtain the curvature radius "R" (mm) of the flexible circuit board 1. The vibrating plate 20 was then vibrated 10,000,000 times with a stroke of 25.4 mm and at a frequency of 25 Hz. A sample where a resistance value of the wiring layer 3 after the vibrations rose 10% or more from a resistance value of the wiring layer 3 before the vibrations was regarded as "defective". The number of tests (N) was set to 20 with respect to each of the samples. Table 2 shows such test results. In addition, "shape maintainability" in Table 2 is evaluation for a shape after the test to determine whether or not the curvature radius "R" (mm) of the bent portion is maintained. Also, "moldability" is examined whether or not the bent portion with the curvature radius "R" (mm) is formed after the flexible circuit board is removed from the mold.

In addition, in Table 2, a standard of moldability and a standard of shape maintainability are as follows.

Good: the curvature radius is less than ±10% of a designed value

Average: the curvature radius is ±10% or more to less than ±20% of the designed value Poor: the curvature radius is ±20% or more of the designed value A standard of appearance is as follows.

Good: no insulating film or insulating layer is observed to be fluid

Poor: the insulating film or the insulating layer is observed to be fluid

TABLE 2

| SAMPLE | MOLD-ABILITY | SHAPE MAINTAIN-ABILITY | APPEAR-ANCE | THE NUMBER OF DEFECT OCCURRENCES IN LED LIGHTING TEST (N = 20) | THE NUMBER OF DEFECT OCCURRENCES IN CONNECTION RELIABILITY TEST (N = 20) |
| --- | --- | --- | --- | --- | --- |
| EXAMPLE 1 | ○ | Δ | ○ | 0 | 0 |
| EXAMPLE 2 | ○ | ○ | ○ | 0 | 0 |
| EXAMPLE 3 | ○ | ○ | ○ | 0 | 0 |
| EXAMPLE 4 | ○ | Δ | ○ | 0 | 0 |
| EXAMPLE 5 | ○ | ○ | ○ | 0 | 0 |
| EXAMPLE 6 | ○ | ○ | ○ | 0 | 0 |
| COMPARATIVE EXAMPLE 1 | X | — | — | — | — |
| COMPARATIVE EXAMPLE 2 | X | — | — | — | — |
| COMPARATIVE EXAMPLE 3 | X | — | — | — | — |
| COMPARATIVE EXAMPLE 4 | X | — | — | — | — |
| COMPARATIVE | X | | | | |

TABLE 2-continued

| SAMPLE | MOLD-ABILITY | SHAPE MAINTAIN-ABILITY | APPEAR-ANCE | THE NUMBER OF DEFECT OCCURRENCES IN LED LIGHTING TEST (N = 20) | THE NUMBER OF DEFECT OCCURRENCES IN CONNECTION RELIABILITY TEST (N = 20) |
|---|---|---|---|---|---|
| EXAMPLE 5 | | | | | |
| COMPARATIVE EXAMPLE 6 | X | — | — | — | — |
| COMPARATIVE EXAMPLE 7 | X | — | — | — | — |
| COMPARATIVE EXAMPLE 8 | Δ | X | ○ | 5 | 20 |
| COMPARATIVE EXAMPLE 9 | Δ | X | ○ | 7 | 20 |
| COMPARATIVE EXAMPLE 10 | X | — | — | — | — |
| COMPARATIVE EXAMPLE 11 | Δ | X | ○ | 4 | 12 |
| COMPARATIVE EXAMPLE 12 | Δ | X | ○ | 6 | 10 |

Facts described below are obtained from the test results. First, as to "moldability" and "shape maintainability", Examples 1 to 6 reached an acceptable level (that is, the bent portion with the curvature radius "R" (mm) was formed and the curvature radius "R" (mm) was maintained even after the "repeated bend test" was performed). However, in Comparative Examples 1 to 12, the bent portion was not formed or the curvature radius "R" (mm) was not maintained through the "repeated bend test" even when the bent portion was formed in some cases. That is, it is found that the bent portion cannot be formed or the curvature "R" (mm) of the bent portion cannot be maintained when the thermosetting resin is used. Also, in this case, a light illumination range was narrow and brightness was uneven since the bent portion was not formed. Also, as to "appearance", all of Examples 1 to 6 reached an acceptable level. Also, as to "the number of defect occurrences in LED lighting test", while no sample was evaluated to be "defective" in Examples 1 to 6, some samples were evaluated to be "defective" in Comparative Examples 8, 9, 11, and 12. Also, as to "connection reliability test", while satisfactory connection reliability was obtained in all of Examples 1 to 6, satisfactory connection reliability was not obtained in Comparative Examples 1 to 12. Also, in Examples 1 to 3 in which the curvature radius "R" (mm) was 0.3 mm, the wiring layer 3 was not separated or broken in the bent portion 1a, and sufficient connection reliability was obtained. As the curvature radius "R" (mm) is increased, a bending stress (stress) applied to the wiring layer 3 is decreased in the bent portion 1a. Thus, it is found that sufficient connection reliability can be obtained when the curvature radius "R" (mm) is at least 0.3 mm or more.

From the above description, the experiment results are concluded as described below.

In the case in which the thermosetting resin is used, the bent portion cannot be formed, or the curvature "R" (mm) of the bent portion cannot be maintained. Also, the sample may be evaluated to be "defective" in the LED lighting test.

In the case in which the thermoplastic resin is used (in the case of the liquid-crystal polymer), it is found that, when the heating temperature is the temperature by which the flexible circuit board has a surface temperature of 150° C. or more and less than the thermal deformation starting temperature of the liquid-crystal polymer and the molding time is about 1 hour, the bent portion 1a can be formed, and the curvature radius "R" (mm) of the bent portion 1a can be maintained and the wiring layer is not separated or disconnected even when the above "repeated bend test" is performed. It is also found that the appearance reaches the acceptable level. In addition, although the heating time is set to 1 hour here, the present inventors have intensively studied to find out that "moldability", "shape maintainability", "appearance", and "connection reliability" sufficiently reach the acceptable levels even when the heating time is 1 hour or less.

When the curvature radius "R" (mm) is 0.3 mm or more and the heating time is 1 hour or less, the flexible circuit board having high connection reliability can be obtained.

That is, the effects of the lighting device and the manufacturing method thereof according to the present embodiment will be summed up below.

Since the LEDs are mounted on the flexible circuit board having the bent portion, the illumination range can be widened, and the intensity of light can be improved.

Since the bent portion is formed, the entire flexible circuit board is deformed to absorb vibrations even when an external force or the like is applied to vibrate the lighting device, and the LEDs are not likely to be damaged due to vibrations.

Since the bent portion can be deformed while maintaining the curvature radius "R" (mm), the wiring layer is not likely to be separated or broken in the bent portion even when vibrations occur. Therefore, the vibration resistance of the lighting device can be improved.

In a conventional case, a complicated process of dispersedly arranging LEDs according to the shape of a lighting device is required so as to illuminate a large range. However, in the present embodiment, the flexible circuit board on which the LEDs are mounted is deformed into any shape after the LEDs are mounted on the planar flexible circuit board. Thus, the present embodiment can be applied to a lighting device of various shapes. The lighting device which does not require the complicated process and can illuminate a large range, and in which the LEDs or the mounting portions thereof are not likely to be damaged even when vibrations occur can be thereby easily manufactured. Also, since the complicated process is not required, a manufacturing cost can be reduced.

Accordingly, with the lighting device and the manufacturing method thereof according to the present embodiment, the lighting device which can illuminate a large range with a simple configuration, and in which the LEDs or the mounting portions thereof are not likely to be damaged even when vibrations occur as a light source device which uses an LED as a light source, and the manufacturing method thereof can be provided.

Other Embodiments

The method for forming the bent portion 1a in the flexible circuit board 1 by using the mold 31 and the pressing members 33 through the process shown in FIGS. 4(a) to 4(d) has been described above. However, the method for forming the bent portion 1a in the flexible circuit board 1 is not limited thereto. When the thermoplastic resin such as liquid-crystal polymer, polyethylene naphthalate, polyethylene terephthalate, and cycloolefin polymer is used for the insulating film 2 and the insulating layer 4, a mold 34 where a space (not shown) such as a groove is provided in a portion in contact with the LEDs may be brought into contact with the flexible circuit board 1 alternately from both sides of the thickness direction of the flexible circuit board 1, and substantially the entire flexible circuit board 1 may be heated in contact with the mold 34 as shown in FIG. 4(e). In addition, by further pressurizing the flexible circuit board 1 so as to hold the flexible circuit board 1 from right and left directions in the drawing, the bent portion 1a can be heated with a sufficient tension being applied to the both ends of the flexible circuit board 1. It is thus not necessary to separately apply a tension by the unillustrated pressurizing means as described above. With the manufacturing method, the bent portion 1a can be formed by heating at a low temperature, so that the LEDs 7 can be protected from damage and deterioration due to heat.

Also, in the above mold 34, a rubber-like elastic member is preferably provided in a contact region with the flexible circuit board 1 in the first step and the second step. Accordingly, the rubber-like elastic member functions as a buffer, so that the flexible circuit board 1 and the LEDs 7 can be protected from impact, wear or the like. That is, in the manufacturing process, there is no risk that the LEDs 7 are crushed by the molding apparatus. Also, since the LEDs 7 and the molding apparatus come into contact with each other via the rubber-like elastic member, heat is not directly transferred to the LEDs 7 during heating, and the LEDs 7 can be prevented from damage due to heat. In addition, the rubber-like elastic material is not specifically limited as long as the material has wear resistance, impact resistance, buckling resistance or the like. For example, urethane rubber, chloroprene rubber, NBR, fluorine rubber, silicon rubber, and natural rubber may be used.

Although the flexible circuit board where the bent portion is formed is applied to the filament section of the lighting device in the above description, the above flexible circuit board may also be applied to a portion other than the filament section. That is, since the flexible circuit board can freely change its shape while maintaining the curvature radius "R" (mm), the flexible circuit board can be applied to various lighting devices by changing the shape of the flexible circuit board according to the shape, the illumination range or the like of the lighting device.

Also, the above flexible circuit board 1 may be at least partially transparent. When the flexible circuit board 1 is partially composed of a transparent material (PET or the like), light emitted from the mounted LEDs 7 is transmitted through the transparent portion, so that a larger range can be illuminated.

| [Reference Signs List] | |
|---|---|
| 1: | Flexible circuit board |
| 2: | Insulating film |
| 3: | Wiring layer |
| 4: | Insulating layer |
| 5: | Adhesive layer |
| 7: | LED |
| 10: | Lighting device |
| 1a: | Bent portion |
| 31: | Mold |
| 33: | Pressing member (partial mold) |

The invention claimed is:

1. A lighting device comprising:
a flexible circuit board having an insulating film made of thermoplastic resin, a wiring layer formed on the insulating film, and an insulating layer formed on the wiring layer and made of thermoplastic resin, and
a plurality of LEDs mounted on the flexible circuit board, the flexible circuit board being formed in a bellows shape having bent portions with a curvature radius "R" of 0.3 mm or more at a plurality of positions, being deformable by expansion and contraction, and maintaining the curvature radius "R" in the bent portions to self-maintain a three-dimensional shape.

2. The lighting device according to claim 1, wherein connecting means connected to a driving circuit that supplies power to the LEDs is provided at both ends of the flexible circuit board.

3. The lighting device according to claim 2, wherein the connecting means is male and female crimp contacts.

4. The lighting device according to claim 1, wherein the thermoplastic resin is liquid-crystal polymer.

5. The lighting device according to claim 1, wherein the flexible circuit board is at least partially transparent.

6. A method for manufacturing a lighting device including:
a deformable flexible circuit board having an insulating film made of thermoplastic resin, a wiring layer formed on the insulating film, and an insulating layer formed on the wiring layer and made of thermoplastic resin, and in which a bent portion with a curvature radius "R" (mm) is formed at at least plural positions; and
a plurality of LEDs mounted on the flexible circuit board, the method comprising:
a first step of bending the flexible circuit board on which the LEDs are mounted by a molding apparatus, and thereby forming the bent portion with the curvature radius "R" (mm) in the flexible circuit board; and
a second step of heating at least the bent portion in the flexible circuit board in which the bent portion with the curvature radius "R" (mm) is formed;
wherein the curvature radius "R" (mm) is 0.3 mm or more, and the flexible circuit board is configured to be deformable while maintaining the curvature radius "R" (mm).

7. The method for manufacturing a lighting device according to claim 6, wherein, in the first step, the bent portion with the curvature radius "R" (mm) is formed in a plurality of numbers in the flexible circuit board by pressing the molding apparatus against the flexible circuit board from a thickness direction with a tension being applied to both ends of the flexible circuit board.

8. The method for manufacturing a lighting device according to claim 6, wherein the first step and the second step are performed by using the molding apparatus where a rubber-like elastic member is provided in a contact region with the flexible circuit board in the first step and the second step.

9. The method for manufacturing a lighting device according to claim 6, wherein the thermoplastic resin is liquid-crystal polymer, and in the second step, a heating temperature is a temperature by which the flexible circuit board has a surface temperature of 150° C. or more and less than a thermal deformation starting temperature of the liquid-crystal polymer, and a heating time is 1 hour or less.

10. The method for manufacturing a lighting device according to claim 6, wherein connecting means connected to a driving circuit that supplies power to the LEDs is provided at both ends of the flexible circuit board.

11. The method for manufacturing a lighting device according to claim 10, wherein the connecting means is male and female crimp contacts.

12. The method for manufacturing a lighting device according to claim 6, wherein the thermoplastic resin is liquid-crystal polymer.

13. The method for manufacturing a lighting device according to claim 6, wherein the flexible circuit board is at least partially transparent.

14. A lighting device comprising:

a flexible circuit board having an insulating film made of thermoplastic resin, a wiring layer formed on the insulating film, and an insulating layer formed on the wiring layer and made of thermoplastic resin, and a plurality of LEDs mounted on the flexible circuit board, and a light transmitting section which covers the LEDs and transmits light emitted from the LEDs, the flexible circuit board being formed in a bellows shape having bent portions with a curvature radius "R" of 0.3 mm or more at a plurality of positions, being deformable by expansion and contraction, and maintaining the curvature radius "R" in the bent portions to self-maintain a three-dimensional shape without being supported by the light transmitting section.

* * * * *